US008867101B2

(12) United States Patent
Shigeta (10) Patent No.: US 8,867,101 B2
(45) Date of Patent: Oct. 21, 2014

(54) PHOTOENGRAVING CONSUMABLE MATERIAL REMOTE ADMINISTRATION METHOD

(71) Applicant: Think Laboratory Co., Ltd., Chiba (JP)

(72) Inventor: Tatsuo Shigeta, Chiba (JP)

(73) Assignee: Think Laboratory Co., Ltd., Chiba (JP)

( * ) Notice: Subject to any disclaimer, the term of this patent is extended or adjusted under 35 U.S.C. 154(b) by 0 days.

(21) Appl. No.: 14/112,413

(22) PCT Filed: Oct. 10, 2012

(86) PCT No.: PCT/JP2012/076201
§ 371 (c)(1),
(2), (4) Date: Oct. 17, 2013

(87) PCT Pub. No.: WO2013/058151
PCT Pub. Date: Apr. 25, 2013

(65) Prior Publication Data
US 2014/0055825 A1        Feb. 27, 2014

(30) Foreign Application Priority Data

Oct. 18, 2011        (JP) ................................. 2011-229051

(51) Int. Cl.
*B41C 1/00*        (2006.01)
*G03F 7/00*        (2006.01)
*G03F 7/004*        (2006.01)

(52) U.S. Cl.
CPC .. *B41C 1/00* (2013.01); *G03F 7/004* (2013.01)
USPC .......... 358/3.3; 358/3.32; 358/1.15; 700/108; 700/112; 700/213; 700/248; 430/300; 101/463.1

(58) Field of Classification Search
None
See application file for complete search history.

(56) References Cited

U.S. PATENT DOCUMENTS

| 5,822,078 | A | * | 10/1998 | Hirai et al. .................... 358/3.32 |
| 6,468,138 | B1 | | 10/2002 | Toyama et al. |
| 2003/0008601 | A1 | | 1/2003 | Toyama et al. |
| 2009/0095633 | A1 | | 4/2009 | Inoue et al. |
| 2012/0308347 | A1 | * | 12/2012 | Shigeta .................... 414/225.01 |
| 2013/0160947 | A1 | * | 6/2013 | Shigeta .................... 156/345.24 |

FOREIGN PATENT DOCUMENTS

| CN | 1692019 A | 11/2005 |
| CN | 101184870 A | 5/2008 |
| EP | 1 887 108 A1 | 2/2008 |
| JP | 06-059438 | 3/1994 |

(Continued)

OTHER PUBLICATIONS

International Preliminary Report on Patentability issued May 1, 2014 for corresponding PCT application No. PCT/JP2012/076201.

(Continued)

*Primary Examiner* — Scott A Rogers
(74) *Attorney, Agent, or Firm* — Rader, Fishman & Grauer PLLC (57) ABSTRACT

Provided is a consumable platemaking material remote administration method which is capable of remotely administrating a consumable platemaking material in each processing device in a fully-automatic platemaking system through a communication network. The consumable platemaking material remote administration method for a processing system for fully-automatic photogravure platemaking includes: providing a central control unit to be connected to the each processing device through a communication line, for receiving status information of a consumable platemaking material in the each processing device; and receiving the status information from the central control unit through a communication network by an external receiving device to remotely administrating the consumable platemaking material.

10 Claims, 4 Drawing Sheets

(56) References Cited

FOREIGN PATENT DOCUMENTS

| | | |
|---|---|---|
| JP | 10-193551 | 7/1998 |
| JP | 2000-024935 A | 1/2000 |
| JP | 2001-200397 A | 7/2001 |
| JP | 2004-070741 A | 3/2004 |
| JP | 2004-223751 A | 8/2004 |
| JP | 2005-133139 A | 5/2005 |
| JP | 2005-195642 A | 7/2005 |
| JP | 2008-221589 A | 9/2008 |
| WO | WO-2004/043698 A1 | 5/2004 |
| WO | WO-2006/126518 A1 | 11/2006 |
| WO | WO-2007-135898 A1 | 11/2007 |
| WO | WO-2007/135899 A1 | 11/2007 |
| WO | WO-2011/125926 A1 | 10/2011 |

OTHER PUBLICATIONS

International Search report issued Nov. 27, 2012 for corresponding PCT application No. PCT/JP2012/076201.
Chinese Office Action issued Jun. 5, 2014 for corresponding Chinese Application No. 201280017605.0.

* cited by examiner

PHOTOENGRAVING CONSUMABLE MATERIAL REMOTE ADMINISTRATION METHOD

TECHNICAL FIELD

The present invention relates to a consumable platemaking material remote administration method in a processing system for fully-automatic photogravure platemaking.

BACKGROUND ART

Hitherto, there have been known photogravure platemaking factories disclosed in, for example, Patent Documents 1 to 3.

Besides, the applicant of this application has proposed a processing system for full-automatic photogravure plate making with a high degree of freedom, which is capable of manufacturing a gravure printing roll more quickly as compared to a conventional case, achieving space saving, performing an unattended operation even in nighttime, flexibly customizing a manufacturing line, and satisfying various customer needs (PCT/JP 2011/58398).

However, each of processing devices of the system described above includes a consumable material which is to be consumed for each platemaking. Therefore, when the amount of the consumable material is decreasing, a lacking amount of the consumable material is required to be supplied. However, a visual confirmation operation for each platemaking process takes time and efforts. However, if the consumable material suddenly becomes in short supply only because the visual confirmation operation takes time and efforts, the platemaking operation is disadvantageously disturbed.

PRIOR ART DOCUMENTS

Patent Documents

Patent Document 1: JP Hei 10-193551 A
Patent Document 2: WO 2007/135898
Patent Document 3: WO 2007/135899
Patent Document 4: JP 2005-133139 A
Patent Document 5: JP 2008-221589 A

SUMMARY OF THE INVENTION

Problems to be Solved by the Invention

The present invention has been made to solve the above-mentioned problem of the related art, and therefore has an object to provide a consumable platemaking material remote administration method which is capable of remotely administrating a consumable platemaking material in each processing device in a fully-automatic platemaking system through a communication network.

Means for Solving Problem

In order to solve the above-mentioned object, according to one embodiment of the present invention, there is provided a consumable platemaking material remote administration method for a processing system for fully-automatic photogravure platemaking comprising a zone A including a handling area of a first industrial robot for chucking and handling a roll to be engraved and a zone B including a handling area of a second industrial robot for chucking and handling the roll to be engraved, the zones A and B being brought into communication with each other, the processing system for fully-automatic photogravure platemaking comprising: at least one processing device, to be provided in the handling area of the first industrial robot provided in the zone A, selected from: a roll stock device; a photosensitive-film application device; an electronic engraving device; a laser exposure device; a degreasing device; a grinding-stone polishing device; an ultrasonic cleaning device; a copper-plating device; a surface-hardened coating formation device; a development device; an etching device; a resist-image removal device; or a paper polishing device; and at least one processing device, to be provided in the handling area of the second industrial robot provided in the zone B, out of the processing devices which are not provided in the zone A, the processing devices provided in the zones A and B being installable and removable, the roll to be engraved being passed between the first industrial robot and the second industrial robot to enable a platemaking process, the consumable platemaking material remote administration method being characterized by comprising:
providing a central control unit to be connected to each of the processing devices through a communication line, for receiving status information of a consumable platemaking material in each of the processing devices; and
receiving the status information from the central control unit through a communication network by an external receiving device to remotely administrating the consumable platemaking material.

With the configuration described above, it is possible to know current conditions of the consumable platemaking material to be used for each of the processing devices of the processing system for fully-automatic photogravure platemaking which is delivered to a user. Therefore, information indicating that the amount of copper oxide, an additive, a photosensitive material, a developer, or the like is running short and information indicating that an electrode or a grinding stone is decreasing can be obtained through the communication network. As a result, there is an advantage in that timing at which a lacking amount of the decreasing consumable platemaking material is to be supplied can be obtained to enable the supply of the consumable platemaking material by delivering the consumable platemaking material before the consumable platemaking material becomes in short supply.

Further, it is preferred that the status information be detected by detection means.

It is preferred that the processing device be the copper-plating device, and that the consumable platemaking material be at least one selected from the group consisting of copper oxide, an additive, and an electrode.

It is preferred that the processing device be the grinding-stone polishing device, and that the consumable platemaking material be a grinding stone.

It is preferred that the processing device be the photosensitive-film application device, and that the consumable platemaking material be a photosensitive material.

It is preferred that the processing device be the development device, and that the consumable platemaking material be a developer.

It is preferred that the processing device be the chromium-plating device, and that the consumable platemaking material be an additive or an electrode.

When the processing device is the copper-plating device and the consumable platemaking material is copper oxide, for example, a scale is mounted to copper-oxide supply means for the copper-plating device as the detection means to weigh the amount of used copper oxide for each time. In this manner, a remaining amount of the copper oxide can be detected. Alternatively, for example, a thickness of plating of a copper-plated plate matrix (hollow roll) is measured so that the amount of used copper oxide is calculated from the thickness of plating by a calculation. In this manner, the remaining amount of the copper oxide can also be detected.

When the processing device is the copper-plating device and the consumable platemaking material is the additive (for example, a brightener, a burnt deposit inhibitor, a leveling agent, or a hardener), a flowmeter is mounted to additive supply means for the copper-plating device as the detection means, for example. By measuring a flow rate of the used additive for each time, a remaining amount of the additive can be detected. Alternatively, for example, a time period in which a pump for feeding the additive from an additive tank is activated is measured. From the time period of activation, the amount of used additive can be calculated by a calculation of the time period. In this manner, a remaining amount of the additive can also be detected.

When the processing device is the copper-plating device and the consumable platemaking material is an electrode (for example, an indium oxide electrode), the detection means, for example, measures a voltage in the copper-plating device at the time of plating so that the consumption of the electrode can be detected from the voltage by a calculation thereof because the voltage at the time of plating becomes higher when the electrode is consumed. As an example of the electrode, for example, a titanium plate having a surface coated with indium oxide can be given. As an example of the copper-plating device, for example, a copper-plating device using an insoluble anode as described in Patent Document 4 is given.

When the processing device is the grinding-stone polishing device and the consumable platemaking material is the grinding stone, the detection means, for example, brings the grinding stone from a point of origin closer to a surface of the plate matrix (hollow roll) and calculates a remaining amount of the grinding stone from a coordinate when the grinding stone is brought into contact therewith. In this manner, the remaining amount of the grinding stone can be detected. Alternatively, for example, by using an infrared ray, the remaining amount of the grinding stone can also be sensed. More specifically, for example, a plurality of infrared transmitters and receivers are respectively linearly arranged on sides of the plate matrix (hollow roll) to enable the detection of the remaining amount of the grinding stone.

When the processing device is the photosensitive-film application device and the consumable platemaking material is the photosensitive material, a flowmeter is mounted to photosensitive-material supply means for the photosensitive-film application device as the detection means, for example. By measuring a flow rate of the used photosensitive material for each time, a remaining amount of the photosensitive material can be detected.

When the processing device is the development device and the consumable platemaking material is the developer, a flowmeter is mounted to developer supply means for the development device as the detection means, for example. By measuring a flow rate of the used developer for each time, a remaining amount of the developer can be detected.

When the processing device is the chromium-plating device and the consumable platemaking material is the additive (for example, a brightener, a burnt deposit inhibitor, a leveling agent, or a hardener), a flowmeter is mounted to additive supply means for the chromium-plating device as the detection means, for example. By measuring a flow rate of the used additive for each time, a remaining amount of the additive can be detected. Alternatively, for example, a time period in which a pump for feeding the additive from an additive tank is activated is measured. By calculating the amount of the used additive from the time period of activation, the remaining amount of the additive can also be detected.

When the processing device is the chromium-plating device and the consumable platemaking material is an electrode (for example, a platinum electrode), the detection means, for example, measures a voltage in the chromium-plating device at the time of plating so that the consumption of the electrode can be detected from the voltage by a calculation because the voltage at the time of plating becomes higher when the electrode is consumed. As an example of the chromium-plating device, for example, a chromium-plating device as described in Patent Document 1 is given.

Moreover, it is more preferred that the processing device be a two-story processing unit which includes vertically arranged two processing devices. With this, a larger number of processing devices can be provided in the range of turning of a robot arm.

It is preferred that the processing device arranged at a lower level in the two-story processing unit includes a roll inlet/outlet opening portion formed on an upper surface of the processing device so that the robot arm can be introduced from the upper surface of the processing device.

It is preferred that the processing device arranged at an upper level in the two-story processing unit includes a roll inlet/outlet opening portion formed on a side surface of the processing device, which is on a side opposed to the industrial robot so that the robot arm can be introduced from the side surface of the processing device.

Advantageous Effects of the Invention

According to one embodiment of the present invention, there can be obtained a remarkable effect of providing the consumable platemaking material remote administration method which is capable of remotely administrating the consumable platemaking material in the each processing device in the fully-automatic platemaking system through a communication network.

BRIEF DESCRIPTION OF DRAWINGS

FIG. 3(a) is a front view and FIG. 3(b) is a side view.

MODES FOR CARRYING OUT THE INVENTION

An embodiment of the present invention is described below, but the embodiment is merely described as an example, and naturally, various modifications may therefore be made without departing from the technical idea of the present invention. In addition, the same members are denoted by the same reference symbols.

Figure 1:
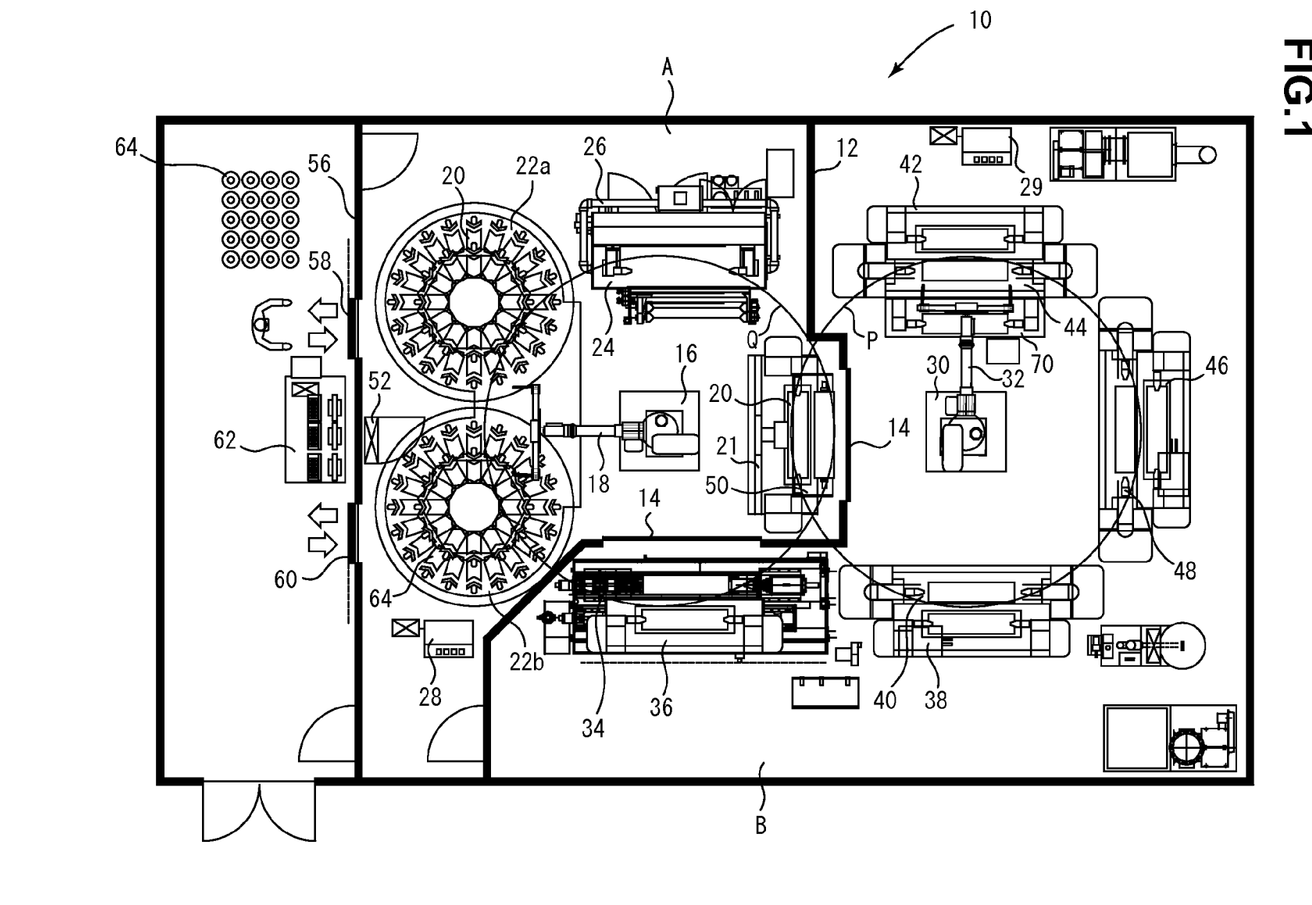
FIG. 1 is a schematic view illustrating an example of a processing system for fully-automatic photogravure platemaking used for a consumable platemaking material remote administration method according to the present invention.

In FIG. 1, reference symbol 10 denotes a processing system for fully-automatic photogravure platemaking used for a consumable platemaking material remote administration method according to the present invention. The processing system 10 for fully-automatic photogravure platemaking includes a zone A and a zone B. The zone A and the zone B are separated away from each other by a wall 12 and are brought into communication with each other through a shutter 14 which can be freely opened and closed.

A configuration of the zone A is described. In the zone A, reference symbol 16 denotes a first industrial robot which has a multi-axial robot arm 18 which can be freely turned. The first industrial robot 16 is controlled by operating a control board 28. Reference symbol Q denotes a range of turning of the robot arm 18, which corresponds to a handling area of the first industrial robot 16.

Reference symbol 20 denotes a roll to be engraved, and reference symbols 22a and 22b denote roll stock devices, respectively. As the roll stock devices, for example, the roll stock devices as disclosed in Patent Documents 2 and 3 can be used.

Reference symbol 24 denotes a photosensitive-film application device, and reference symbol 26 denotes a laser exposure device. In the illustrated example, the photosensitive-film application device 24 is provided on the laser exposure device 26. Conventionally known devices can be used as the devices described above. For example, the photosensitive-film application devices and the laser exposure devices as disclosed in Patent Documents 1 to 3 can be used. Reference symbol 50 denotes a roll relay stand for placing the roll 20 to be engraved thereon for relay. Below the roll relay stand 50, a paper polishing device 21 for polishing with paper is provided. As the paper polishing device 21, for example, the paper polishing devices as disclosed in Patent Documents 1 to 3 can be used. In the zone A, a main control board 52 for controlling the processing system 10 for fully-automatic photogravure platemaking is provided.

In the illustrated example, a case where the photosensitive-film application device 24 is provided and the laser exposure device 26 performs exposure to laser light is described. However, a method of providing an electronic engraving device to perform electronic engraving may also be used. As the electronic engraving device, conventionally known devices can be adopted. For example, the electronic engraving devices as disclosed in Patent Documents 2 and 3 can be used.

Next, a configuration of the zone B is described. In the zone B, reference symbol 30 denotes a second industrial robot including a multi-axial robot arm 32 which can be freely turned. The second industrial robot 30 is controlled by operating a control board 29. Reference symbol P denotes a range of turning of the robot arm 32, which corresponds to a handling area of the second industrial robot 30.

Reference symbol 34 denotes a grinding-stone polishing device, and reference symbol 36 denotes an ultrasonic cleaning device. A conventionally known device can be adopted as the grinding-stone polishing device 34. For example, the grinding-stone polishing devices as disclosed in Patent Documents 4 to 5 can be used. The ultrasonic cleaning device 36 includes a storage tank for storing washing water and ultrasonic transducers provided to a lower portion of the storage tank, and is capable of performing cleaning by oscillating the washing water by ultrasonic oscillations of the ultrasonic transducers.

Reference symbol 38 denotes a degreasing device, and reference symbol 40 denotes a copper-plating device. A conventionally known device can be adopted as those devices. For example, the electric degreasing devices and copper-plating devices as disclosed in Patent Documents 1 to 3 can be used.

Reference symbol 42 denotes a development device, and reference symbol 44 denotes an etching device. A conventionally known device can be adopted as those devices. For example, the development devices and etching devices as disclosed in Patent Documents 1 to 3 can be used.

Reference symbol 46 denotes a resist stripping device, and reference symbol 48 denotes a chromium-plating device. A conventionally known device can be adopted as the resist stripping device. For example, the resist stripping devices as disclosed in Patent Documents 1 to 3 can be used. As the chromium-plating device, a conventionally known device can be used. For example, the chromium-plating device as disclosed in Patent Document 1 can be used. In the illustrated example, the chromium-plating device is used as an example of a surface-hardened coating formation device. Besides, a DLC coating formation device and a silicon-dioxide coating formation device can be adopted as the surface-hardened coating formation device. As the DLC-coating formation device, for example, the DLC-coating formation device as disclosed in Patent Document 2 can be used. As the silicon-dioxide coating formation device, for example, the silicon-dioxide coating formation device as disclosed in Patent Document 3 can be used.

Reference symbol 70 denotes a water-washing and drying device, and performs water washing and drying for each process as needed.

In the illustrated example, the above-mentioned zone A is configured as a clean room. The zones A and B can be respectively configured as clean rooms as needed.

Doors 58 and 60 are provided on a wall 56 of the zone A. Through the doors, an engraved roll is brought out and a new roll to be engraved (plate matrix) is introduced. The engraved roll is placed on any one of the roll stock devices 22a and 22b, whereas the roll to be engraved is placed on the other roll stock device. A computer 62 is provided outside of the zone A. Various types of information are checked and administered, and various programs are set thereon. Reference symbol 64 denotes manufactured engraved rolls.

Referring to FIG. 1, the functions of the processing system 10 for fully-automatic photogravure platemaking according to the present invention are described. The roll 20 to be engraved, which is placed on any one of the roll stock devices 22a and 22b, is chucked by the first industrial robot 16 to be placed on the roll relay stand 50 so as to be passed to the second industrial robot 30. The roll 20 to be engraved is chucked by the second industrial robot 30, and is transported to the degreasing device 38. Then, the roll 20 to be engraved is released so as to be placed in the degreasing device 38.

After a degreasing operation by the degreasing device 38 is finished, the second industrial robot 30 chucks the roll 20 to be engraved and transports the roll 20 to be engraved to the copper-plating device 40. Then, the roll 20 to be engraved is released so as to be placed in the copper-plating device 40.

After a plating operation by the copper-plating device 40 is finished, the second industrial robot 30 chucks the roll 20 to be engraved, and transports and places the roll 20 to be engraved on the roll relay stand 50 so as to pass the roll 20 to be engraved to the first industrial robot 16. After chucking the roll 20 to be engraved and transporting the roll 20 to be engraved to the grinding-stone polishing device 34, the first industrial robot 16 releases the roll 20 to be engraved and places the roll 20 to be engraved in the grinding-stone polishing device 34.

After a grinding-stone polishing operation by the grinding-stone polishing device 34 is finished, the first industrial robot 16 chucks the roll 20 to be engraved and transports the roll 20 to be engraved to the ultrasonic cleaning device 36. Then, the roll 20 to be engraved is released so as to be placed in the ultrasonic cleaning device 36.

After an ultrasonic cleaning operation by the ultrasonic cleaning device 36 is finished, the first industrial robot 16 chucks the roll 20 to be engraved and transports the roll 20 to be engraved to the photosensitive-film application device 24. Then, the roll 20 to be engraved is released so as to be placed in the photosensitive-film application device 24.

After a photosensitive-film application operation by the photosensitive-film application device 24 is finished, the first industrial robot 16 chucks the roll 20 to be engraved and transports the roll 20 to be engraved to the laser exposure device 26. Then, the roll 20 to be engraved is released so as to be placed in the laser exposure device 26.

After a laser operation by the laser exposure device 26 is finished, the first industrial robot 16 chucks the roll 20 to be engraved and places the roll 20 to be engraved to the roll relay stand 50. Then, the roll 20 to be engraved is passed to the second industrial robot 30. The roll 20 to be engraved is chucked by the second industrial robot 30, and is transported to the development device 42. Then, the roll 20 to be engraved is released so as to be placed in the development device 42.

After a development operation by the development device 42 is finished, the second industrial robot 30 chucks the roll 20 to be engraved and transports the roll 20 to be engraved to the etching device 44. Then, the roll 20 to be engraved is released so as to be placed in the etching device 44.

After an etching operation by the etching device 44 is finished, the second industrial robot 30 chucks the roll 20 to be engraved and transports the roll 20 to be engraved to the resist stripping device 46. Then, the roll 20 to be engraved is released so as to be placed in the resist stripping device 46.

After a resist stripping operation by the resist stripping device 46 is finished, the second industrial robot 30 chucks the roll 20 to be engraved and transports the roll 20 to be engraved to the chromium-plating device 48. Then, the roll 20 to be engraved is released so as to be placed in the chromium-plating device 48. Then, chromium plating is performed by the chromium-plating device 48. The roll 20 to be engraved is washed with water and dried in the water-washing and drying device 70 for each process.

After a plating operation by the chromium-plating device 48 is finished, the second industrial robot 30 chucks the roll 20 to be engraved and transports the roll 20 to be engraved to the paper polishing device 21. Then, the roll 20 to be engraved is released so as to be placed in the paper polishing device 21. After the paper polishing (automatic polishing) by the paper polishing device 21, the engraved roll 64 is obtained and is placed on the roll stock device 22b in the illustrated example.

The thus obtained engraved roll 64 is brought out of the zone A to be completed.

The functions described above are a mere example of the processing system for fully-automatic photogravure platemaking of the present invention. By flexibly customizing a manufacturing line in accordance with customer needs, a platemaking line can be achieved in various modes.

In the example illustrated in FIG. 1, the roll 20 to be engraved is transported to each of the processing devices and the roll 20 to be engraved is released so as to be placed in the processing device by using the industrial robot as disclosed in any one of Patent Documents 1 to 3 as the first industrial robot 16 or the second industrial robot 30, and the roll to be engraved is then rotated by driving means provided to the processing device.

On the other hand, an industrial robot provided with driving means, which is disclosed in Patent Document 5, may be used as the first industrial robot or the second industrial robot. Therefore, a configuration may be such that the roll 20 to be engraved is transported to each of the processing devices so as to be placed in the processing device while the roll 20 to be engraved is gripped and the roll to be engraved is then rotated by the driving means provided to the industrial robot.

Moreover, each of the processing devices of the processing system 10 for fully-automatic photogravure platemaking is suitably configured as a two-story processing unit including vertically arranged two processing devices as needed. In this manner, a larger number of processing devices can be provided within the range of turning of the robot arm.

Figure 2:
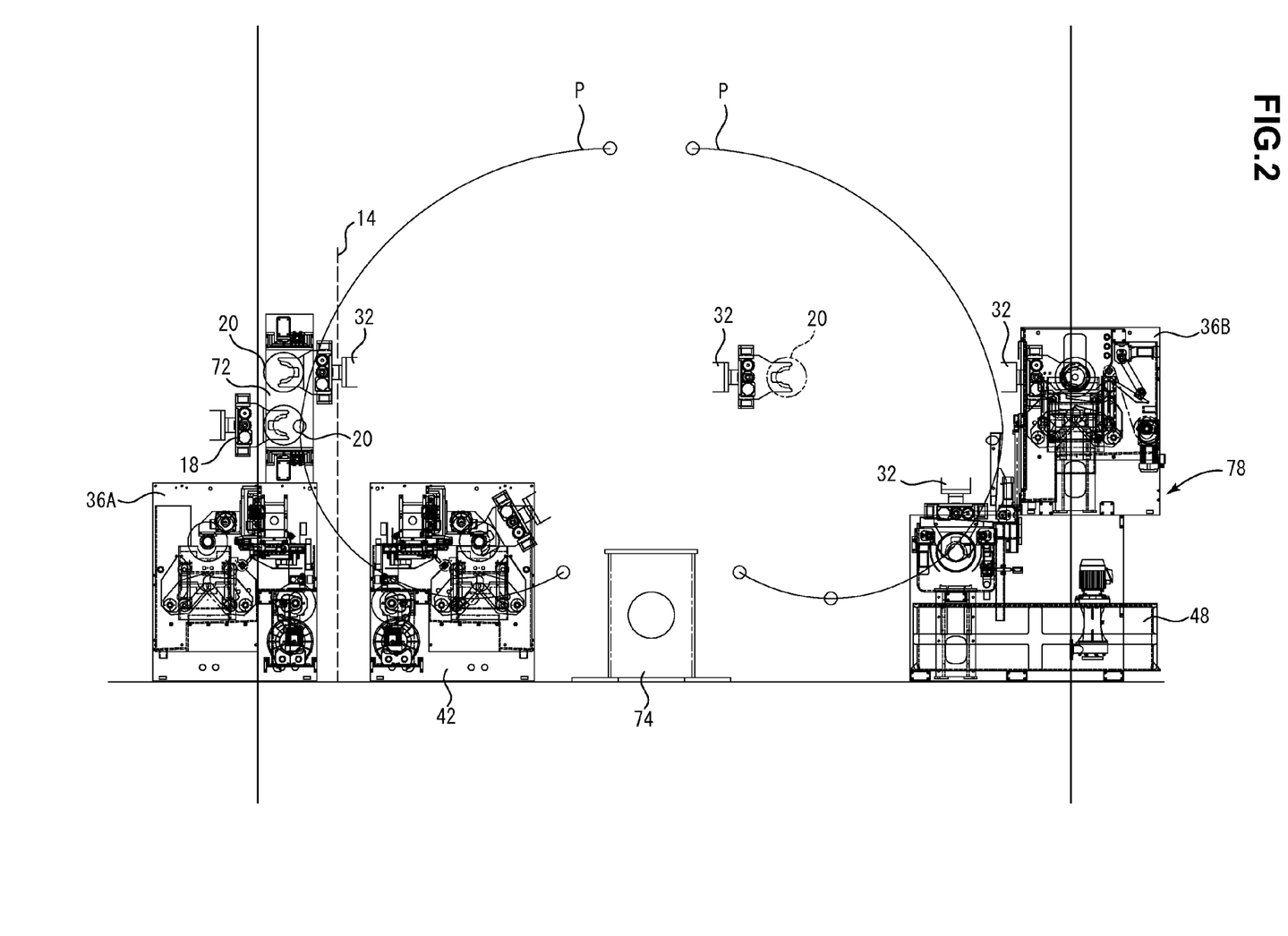
FIG. 2 is a schematic view illustrating an example where a two-story processing unit is adopted for the processing system for fully-automatic photogravure platemaking.
Figure 3:
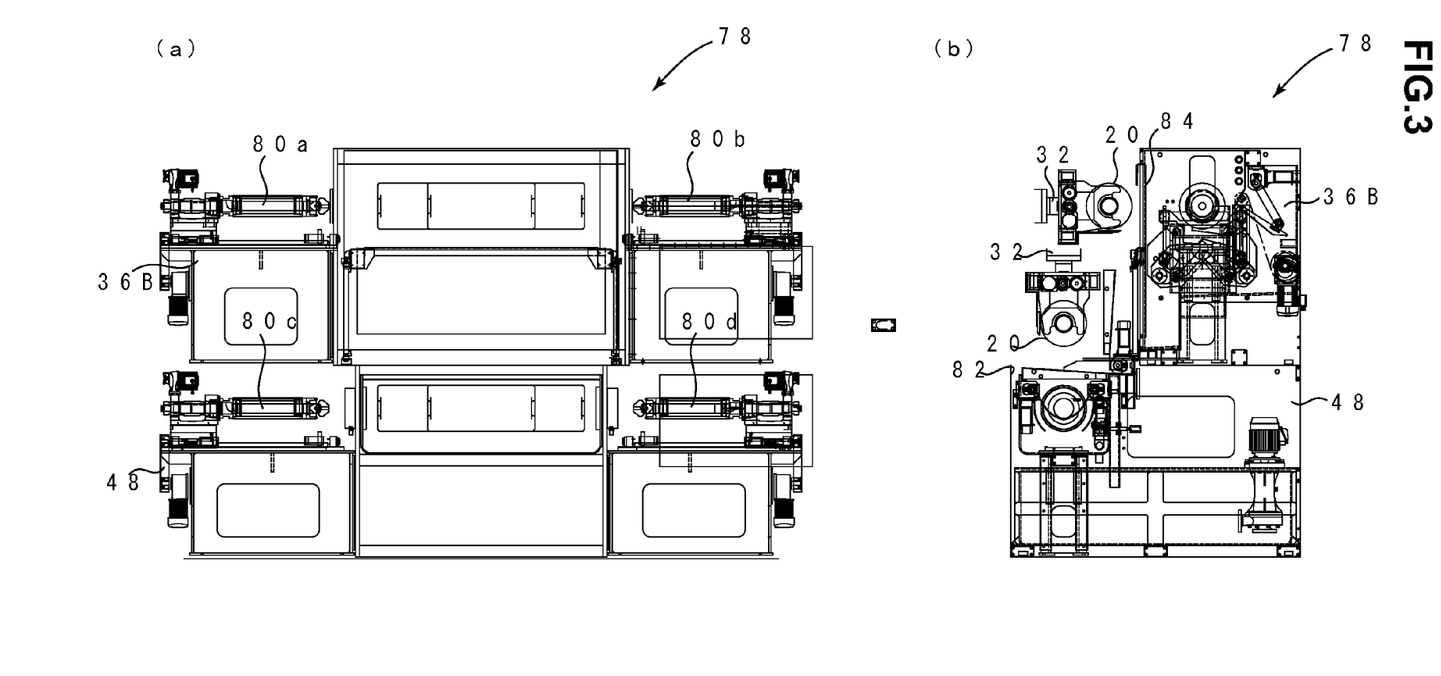
FIG. 3 are schematic views illustrating an example of the two-story processing unit for the processing system for fully-automatic photogravure platemaking, where

An example of the two-story processing unit is illustrated in FIGS. 2 and 3. As in the processing system 10 for fully-automatic photogravure platemaking illustrated in FIG. 1, two-story processing units illustrated in FIGS. 2 and 3 are provided within the range Q of turning of the robot arm 18 of the first industrial robot 16 provided in the zone A and the range P of turning of the robot arm 32 of the second industrial robot 30 provided in the zone B.

In FIG. 1, reference symbol 36A denotes a first ultrasonic cleaning device which is provided within the range Q of the turning of the robot arm 18 of the first industrial robot 16 provided in the zone A. Above the ultrasonic cleaning device 36A, a two-story roll relay stand 72 including vertically arranged two roll gripping means is provided.

The two-story roll relay stand 72 includes vertically arranged roll chucking means for gripping the roll 20 to be engraved, and therefore can store two rolls to be engraved in a vertically arranged fashion, as illustrated in FIG. 2.

The roll 20 to be engraved is transported into the lower roll chucking means of the two-story roll relay stand 72 by the robot arm 18 of the first industrial robot 16 provided in the zone A.

The roll 20 to be engraved is transported into the upper roll chucking means of the two-story roll relay stand 72 by the robot arm 32 of the second industrial robot 30 provided in the zone B.

Therefore, the two-story roll relay stand 72 is provided with a lower side-surface opening portion through which the roll 20 to be engraved is to be transported by the robot arm 18 of the first industrial robot 16 provided in the zone A and an upper side-surface opening portion through which the roll 20 to be engraved is to be transported by the robot arm 32 of the second industrial robot 30 provided in the zone B.

Reference symbol 14 denotes the shutter. The development device 42 is provided in the zone B beyond the shutter. Reference symbol 74 denotes an installation stand for the second industrial robot 30 provided in the zone B.

Within the range P of turning of the robot arm 32 of the second industrial robot 30 provided in the zone B, a second ultrasonic cleaning device 36B is placed on the chromium-plating device 48 to form a two-story processing unit 78. Then, the roll 20 to be engraved is transported into each of the chromium-plating device 48 at the lower level and the second ultrasonic cleaning device 36B at the upper level by the robot arm 32 of the second industrial robot 30 provided in the zone B so as to be processed therein.

In the two-story processing unit, a processing device which uses a relatively large amount of liquid is preferably provided at the lower level and a processing device which uses a relatively small amount of liquid is preferably provided at the upper level.

For example, a two-story processing unit including the copper-plating device provided at the lower level and the degreasing device provided at the upper level is preferable.

For example, a two-story processing unit including the etching device provided at the lower level and the resist stripping device provided at the upper level is preferable.

For example, a two-story processing unit including the chromium-plating device provided at the lower level and the ultrasonic cleaning device provided at the upper level is preferable.

In FIG. 3, reference symbol 78 denotes the two-story processing unit. In the illustrated example, the lower-level processing device in the two-story processing unit 78 is the chromium-plating device 48 and the upper-level processing device is the second ultrasonic cleaning device 36B. Reference symbols 80a to 80d denote roll chuck members for chucking and gripping the roll 20 to be engraved. Basic configurations of the processing devices described above are known as disclosed in, for example, Patent Documents 1 to 3. However, in the two-story processing unit 78, the two-story configuration is used, which differs from the conventional processing devices, and the individual roll inlet/outlet opening portions for bringing in and out the roll to be engraved are provided so as to correspond to a robot hand.

The chromium-plating device 48 provided at the lower level in the two-story processing unit 78 includes a roll inlet/outlet opening portion 82 formed on an upper surface of the chromium-plating device 48 so as to allow the introduction of the robot arm 32 from the upper surface of the device.

The second ultrasonic cleaning device 36B provided at the upper level in the two-story processing unit 78 includes a roll inlet/outlet opening portion 84 on a side surface on a side opposed to the second industrial robot 30 so as to allow the introduction of the robot arm 32 from the side surface of the device.

Shutter members are respectively provided to the roll inlet/outlet opening portions 82 and 84, and are automatically opened when the robot arm 32 transports the roll 20 to be engraved thereto. After the roll to be engraved is chucked by the roll chuck members 80a to 80d, the robot arm 32 moves out of the two-story processing unit 78. Then, the shutter members are closed to prevent the entrance of dust, dirt, and the like.

With the configuration described above, various processing devices can be provided in the handling area of the industrial robot. Therefore, there is an advantage in that a space is reduced by about half as compared with, for example, the conventional fully-automatic platemaking systems as described in Patent Documents 1 to 3. Moreover, there is another advantage in that power consumption is reduced by about half as compared with, for example, the conventional fully-automatic platemaking system as described in Patent Document 1.

In the processing system for fully-automatic photogravure platemaking which can be flexibly customized as described above, the consumable platemaking material remote administration method of the present invention is used.

Figure 4:
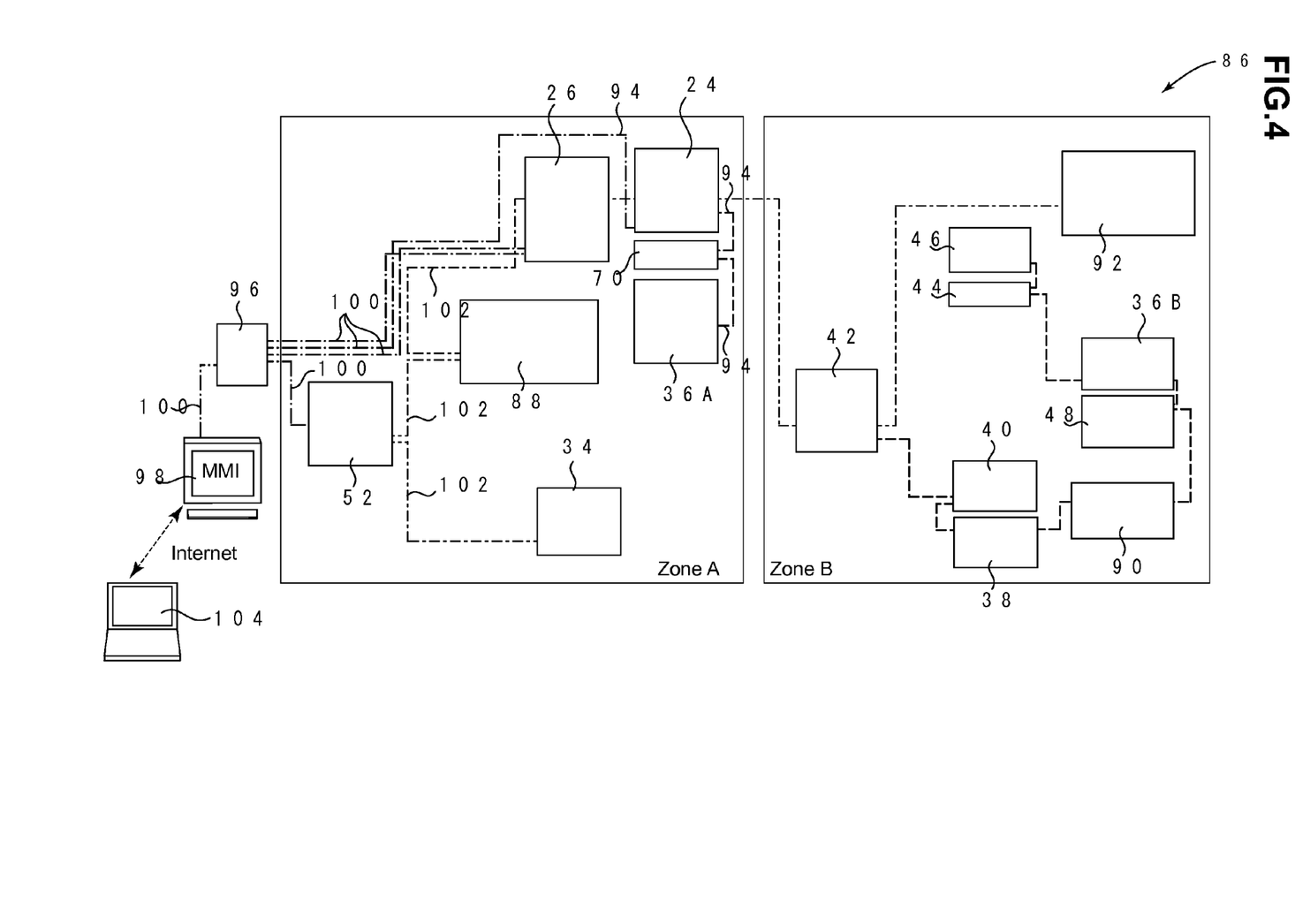
FIG. 4 is a block diagram illustrating an example of the processing system for fully-automatic photogravure platemaking used for the consumable platemaking material remote administration method according to the present invention.

FIG. 4 illustrates a block diagram illustrating an example of the processing system for fully-automatic photogravure platemaking used for the consumable platemaking material remote administration method according to the present invention.

In FIG. 4, a processing system 86 for fully-automatic photogravure platemaking has the zone A including the handling area of the first industrial robot for chucking and handling the roll to be engraved and the zone B including the handling area of the second industrial robot for chucking and handling the roll to be engraved. The zones A and B are brought into communication with each other.

In the handling area of the first industrial robot provided in the zone A, the photosensitive-film application device 24, the laser exposure device 26, the first ultrasonic cleaning device 36A, the water-washing and drying device 70 for water-washing and drying the roll to be engraved, and the grinding-stone polishing device 34 are provided. In the zone A, a first robot control computer 88 for controlling the first industrial robot 16 and the main control board 52 are provided.

In the handling area of the second industrial robot 30 provided in the zone B, there are provided the development device 42, the resist stripping device 46, the etching device 44, the second ultrasonic cleaning device 36B, the chromium-plating device 48, the copper-plating device 40, the degreasing device 38, and a copper-plating control device 90 for controlling plating solution of the copper-plating device 40. As the copper-plating control device 90, for example, a liquid automatic measuring and pouring device disclosed in Patent Document 4 can be adopted. In the zone B, a second robot control computer 92 for controlling the second industrial robot 30 is provided.

The photosensitive-film application device 24 and the water-washing and drying device 70, and the water-washing and drying device 70 and the first ultrasonic cleaning device 36A are connected to each other by cables 94 so as to be subjected to sequence control. In the illustrated example, the photosensitive-film application device 24 and the first ultrasonic cleaning device 36A are configured as the two-story processing unit. The first ultrasonic cleaning device 36A is provided at the lower level, whereas the photosensitive-film application device 24 is provided at the upper level.

The photosensitive-film application device 24, the laser exposure device 26, and the main control board 52 are connected to an MMI (man machine interface) as a central control unit 98 through a hub (concentrator) 96 by LAN cables 100 so as to be networked. As the central control unit 98, a computer into which programs are incorporated can be adopted.

The photosensitive-film application device 24 is PLC-connected to the laser exposure device 26 by a PLC (power line communication) cable 102. The laser exposure device 26 and the first robot control computer 88, the first robot control computer 88 and the main control board 52, and the main control board 52 and the grinding-stone polishing device 34 are respectively PLC-connected to each other.

Further, the photosensitive-film application device 24 is PLC-connected to the development device 42 provided in the zone B. The development device 42 is PLC-connected to the second robot control computer 92.

The resist stripping device 46 and the etching device 44, the second ultrasonic cleaning device 36B and the chromium-plating device 48, and the copper-plating device 40, the degreasing device 38, and the copper-plating control device 90 are connected to each other by cables so as to be subjected to sequence control. In the illustrated example, the resist stripping device 46 and the etching device 44 are configured as a two-story processing unit. The etching device 44 is provided at the lower level, whereas the resist stripping device 46 is provided at the upper level.

Further, the etching device 44 and the second ultrasonic cleaning device 36B, the chromium-plating device 48 and the copper-plating control device 90, the copper-plating control device 90 and the degreasing device 38, and the copper-plating device 40 and the development device 42 are connected to each other by cables so as to be subjected to sequence control.

In the illustrated example, the second ultrasonic cleaning device 36B and the chromium-plating device 48 are configured as a two-story processing unit. The chromium-plating device 48 is provided at the lower level, whereas the second ultrasonic cleaning device 36B is provided at the upper level.

In the illustrated example, the copper-plating device 40 and the degreasing device 38 are configured as a two-story processing unit. The copper-plating device 40 is provided at the lower level, whereas the degreasing device 38 is provided at the upper level.

As described above, the central control unit 98 is provided, which is connected to each of the processing devices provided in the zones A and B through a communication line so as to receive status information of the consumable platemaking material in the processing devices. An external receiving device 104 receives the status information from the central control unit 98 through a communication network to remotely administrate the consumable platemaking material. As the communication network, for example, the Internet can be used. As the external receiving device 104, a general-purpose computer can be used.

With the configuration described above, a manufacturer of the processing system 86 for fully-automatic photogravure platemaking is able to know current conditions of the consumable platemaking material used in each of the processing devices such as the copper-plating device 40, which are included in the processing system 86 for fully-automatic photogravure platemaking delivered to a user. Therefore, information indicating that the amount of copper oxide, the additive, the photosensitive material, or the developer is running short or information indicating that the electrode or the grinding stone is decreasing can be received by the external receiving device 104 through the communication network. As a result, timing at which a lacking amount of the decreasing consumable platemaking material is to be supplied can be obtained. Therefore, before the consumable platemaking material becomes in short supply, the consumable platemaking material is delivered to the user. In this manner, a lacking amount of the consumable platemaking material can be supplied.

Further, the status information may be configured to be detected by detection means.

When the processing device is the copper-plating device 40, at least one selected from the group consisting of copper oxide, the additive, and the electrode is used as the consumable platemaking material.

When the processing device is the grinding-stone polishing device 34, the consumable platemaking material is a grinding stone.

When the processing device is the photosensitive-film application device 24, the consumable platemaking material is a photosensitive material.

When the processing device is the development device 42, the consumable platemaking material is a developer.

When the processing device is the chromium-plating device 48, the consumable platemaking material is an additive or an electrode.

When the processing device is the copper-plating device 40 and the consumable platemaking material is copper oxide, for example, a scale is mounted to copper-oxide supply means for the copper-plating device 40 as the detection means to weigh the amount of used copper oxide for each time. In this manner, a remaining amount of the copper oxide can be detected. Alternatively, for example, a thickness of plating of a copper-plated plate matrix (hollow roll) is measured so that the amount of used copper oxide is calculated from the thickness of plating. In this manner, the remaining amount of the copper oxide can also be detected.

When the processing device is the copper-plating device 40 and the consumable platemaking material is the additive (for example, a brightener, a burnt deposit inhibitor, a leveling agent, or a hardener), a flowmeter is mounted to additive supply means for the copper-plating device 40 as the detection means, for example. By measuring a flow rate of the used additive for each time, a remaining amount of the additive can be detected. Alternatively, for example, a time period in which a pump for feeding the additive from an additive tank is activated is measured. From the time period of activation, the amount of used additive can be calculated by a calculation of the time period. In this manner, a remaining amount of the additive can also be detected.

When the processing device is the copper-plating device 40 and the consumable platemaking material is an electrode (for example, an indium oxide electrode), the detection means, for example, measures a voltage in the copper-plating device at the time of plating so that the consumption of the electrode can be detected from the voltage by a calculation because the voltage at the time of plating becomes higher when the electrode is consumed.

When the processing device is the grinding-stone polishing device 34 and the consumable platemaking material is the grinding stone, the detection means, for example, brings the grinding stone from a point of origin closer to a surface of the plate matrix (hollow roll) and calculates a remaining amount of the grinding stone from a coordinate when the grinding stone is brought into contact therewith. In this manner, the remaining amount of the grinding stone can be detected. Alternatively, for example, by using an infrared ray, the remaining amount of the grinding stone can also be sensed. More specifically, for example, a plurality of infrared transmitters and receivers are respectively linearly arranged on sides of the plate matrix (hollow roll) to enable the detection of the remaining amount of the grinding stone.

When the processing device is the photosensitive-film application device 24 and the consumable platemaking material is the photosensitive material, a flowmeter is mounted to photosensitive-material supply means for the photosensitive-film application device 24 as the detection means, for example. By measuring a flow rate of the used photosensitive material for each time, a remaining amount of the photosensitive material can be detected.

When the processing device is the development device 42 and the consumable platemaking material is the developer, a flowmeter is mounted to developer supply means for the development device as the detection means, for example. By measuring a flow rate of the used developer for each time, a remaining amount of the developer can be detected.

When the processing device is the chromium-plating device 48 and the consumable platemaking material is the additive (for example, a brightener, a burnt deposit inhibitor, a leveling agent, or a hardener), a flowmeter is mounted to additive supply means for the chromium-plating device 48 as the detection means, for example. By measuring a flow rate of the used additive for each time, a remaining amount of the additive can be detected. Alternatively, for example, a time period in which a pump for feeding the additive from an additive tank is activated is measured. By calculating the amount of the used additive from the time period of activation, the remaining amount of the additive can also be detected.

When the processing device is the chromium-plating device 48 and the consumable platemaking material is an electrode (for example, a platinum electrode), the detection means, for example, measures a voltage in the chromium-plating device at the time of plating so that the consumption of the electrode can be detected from the voltage by a calculation because the voltage at the time of plating becomes higher when the electrode is consumed.

INDUSTRIAL APPLICABILITY

According to the consumable platemaking material remote administration method of the present invention, timing at which the lacking amount of the decreasing consumable platemaking material is to be supplied can be obtained in the processing system for fully-automatic photogravure platemaking delivered to the user. By delivering the consumable platemaking material to the user before the consumable platemaking material becomes in short supply, the lacking amount of the consumable platemaking material can be supplied.

REFERENCE SIGNS LIST

10: processing system for fully-automatic photogravure platemaking, 12: wall, 14: shutter, 16: first industrial robot, 18, 32: robot arm, 20: roll to be engraved, 21: paper polishing device, 22a, 22b: roll stock device, 24: photosensitive-film application device, 26: laser exposure device, 28, 29: control board, 30: second industrial robot, 34: grinding-stone polishing device, 36: ultrasonic cleaning device, 36A: first ultrasonic cleaning device, 36B: second ultrasonic cleaning device, 38: degreasing device, 40: copper-plating device, 42: development device, 44: etching device, 46: resist stripping device, 48: chromium-plating device, 50: roll relay stand, 52: main control board, 56: wall, 58, 60: door, 62: computer, 64: engraved roll, 70: water-washing and drying device, 72: two-story roll relay stand, 74: installation stand, 78: two-story processing unit, 80a to 80d: roll chuck member, 82, 84: roll inlet/outlet opening portion, 86: processing system for fully-automatic photogravure platemaking, 88: first robot control computer, 90: copper-plating control device, 92: second robot control computer, 94: cable, 96: hub, 98: central control unit, 100: LAN cable, 102: PLC cable, 104: external receiving device, A: zone A, B: zone B, P, Q: range of turning

The invention claimed is:

1. A consumable platemaking material remote administration method for a processing system for fully-automatic photogravure platemaking comprising a zone A including a handling area of a first industrial robot for chucking and handling a roll to be engraved and a zone B including a handling area of a second industrial robot for chucking and handling the roll to be engraved, the zones A and B being brought into communication with each other, the processing system for fully-automatic photogravure platemaking comprising: at least one processing device, to be provided in the handling area of the first industrial robot provided in the zone A, selected from: a roll stock device; a photosensitive-film application device; an electronic engraving device; a laser exposure device; a degreasing device; a grinding-stone polishing device; an ultrasonic cleaning device; a copper-plating device; a surface-hardened coating formation device; a development device; an etching device; a resist-image removal device; or a paper polishing device; and at least one processing device, to be provided in the handling area of the second industrial robot provided in the zone B, out of the processing devices which are not provided in the zone A, the processing devices provided in the zones A and B being installable and removable, the roll to be engraved being passed between the first industrial robot and the second industrial robot to enable a platemaking process, the consumable platemaking material remote administration method comprising:

providing a central control unit to be connected to each of the processing devices through a communication line, for receiving status information of a consumable platemaking material in each of the processing devices; and receiving the status information from the central control unit through a communication network by an external receiving device to remotely administrating the consumable platemaking material.

2. A consumable platemaking material remote administration method according to claim 1, wherein the status information is detected by detection means.

3. A consumable platemaking material remote administration method according to claim 1, wherein:

the processing device is the copper-plating device; and the consumable platemaking material is at least one selected from the group consisting of copper oxide, an additive, and an electrode.

4. A consumable platemaking material remote administration method according to claim 1, wherein:

the processing device is the grinding-stone polishing device; and the consumable platemaking material is a grinding stone.

5. A consumable platemaking material remote administration method according to claim 1, wherein:

the processing device is the photosensitive-film application device; and the consumable platemaking material is a photosensitive material.

6. A consumable platemaking material remote administration method according to claim 1, wherein:

the processing device is the development device; and the consumable platemaking material is a developer.

7. A consumable platemaking material remote administration method according to claim 1, wherein:

the processing device is the chromium-plating device; and the consumable platemaking material is an additive or an electrode.

8. A consumable platemaking material remote administration method according to claim 1, wherein the processing device is a two-story processing unit including vertically arranged two processing devices.

9. A consumable platemaking material remote administration method according to claim 8, wherein the processing device to be provided at a lower level in the two-story processing unit includes a roll inlet/outlet opening portion formed on an upper surface of the processing device to be provided at the lower level so as to allow introduction of a robot arm from the upper surface of the processing device to be provided at the lower level.

10. A consumable platemaking material remote administration method according to claim 8, wherein the processing device to be provided at an upper level in the two-story processing unit includes a roll inlet/outlet opening portion formed on a side surface of the processing device to be provided at the upper level on a side opposed to the industrial robot so as to allow introduction of a robot arm from the side surface of the processing device to be provided at the upper level.

* * * * *